United States Patent
Shimoma et al.

(10) Patent No.: US 7,385,196 B2
(45) Date of Patent: Jun. 10, 2008

(54) METHOD AND SCANNING ELECTRON MICROSCOPE FOR MEASURING WIDTH OF MATERIAL ON SAMPLE

(75) Inventors: Goroku Shimoma, Minori (JP); Tadashi Otaka, Hitachinaka (JP); Mitsugu Sato, Hitachinaka (JP); Hideo Todokoro, Hinode (JP); Shunichi Watanabe, Hitachinaka (JP); Tadanori Takahashi, Hitachinaka (JP); Masahiro Kawawa, Hitachinaka (JP); Masanori Gunji, Hitachinaka (JP); Terumichi Nishino, Johoku (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 10/911,480

(22) Filed: Aug. 5, 2004

(65) Prior Publication Data

US 2005/0006581 A1    Jan. 13, 2005

Related U.S. Application Data

(63) Continuation of application No. 10/246,453, filed on Sep. 19, 2002, now Pat. No. 6,791,084.

(30) Foreign Application Priority Data

Oct. 12, 2001    (JP)    ............................ 2001-314695

(51) Int. Cl.
*H01J 37/28*    (2006.01)

(52) U.S. Cl. ....................................... 250/310; 250/307
(58) Field of Classification Search ................ 250/307, 250/310
See application file for complete search history.

(56) References Cited

U.S. PATENT DOCUMENTS

| 5,117,111 A | 5/1992 | Nakamura et al. |
| 5,750,990 A | 5/1998 | Mizuno et al. |
| 6,166,380 A * | 12/2000 | Kitagawa et al. ........... 250/307 |
| 6,396,059 B1 | 5/2002 | Singh et al. |

FOREIGN PATENT DOCUMENTS

| EP | 0 781 976 A2 | 7/1997 |
| EP | 0 877 409 A2 | 11/1998 |
| JP | 63-042407 A | 2/1988 |
| JP | 02-190708 A | 7/1990 |
| JP | 6-347246 | 12/1994 |
| JP | 11-25898 | 1/1999 |
| JP | 11-224640 | 8/1999 |

* cited by examiner

*Primary Examiner*—David Vanore
(74) *Attorney, Agent, or Firm*—Dickstein Shapiro LLP

(57) ABSTRACT

A width-measurement method of reducing or eliminating an error in measurement of a width of an object on a sample resulting from the dimension of the beam diameter, wherein a width-measured value of the object to be width-measured which has been obtained on the basis of a secondary signal obtained from secondary particles emitted from the sample having thereon the object to be width-measured is corrected with a value with respect to a dimension value of a beam diameter.

4 Claims, 8 Drawing Sheets

| MEASURING APPARATUS | S-900-1kV | | S-900-5kV | |
|---|---|---|---|---|
| MATERIAL | W | C | W | C |
| ACTUAL DIMENSION (nm) | 5.6 | 11.1 | 5.6 | 11.1 |
| MEASURED DIMENSION | B 9.4 | A 7.3 | B 7.4 | A 9.3 |
| DIMENSION DIFFERENCE | 3.8 | −3.8 | 1.8 | −1.8 |
| BEAM DIAMETER (nm) | ABOUT 4 | | ABOUT 2 | |

METHOD AND SCANNING ELECTRON MICROSCOPE FOR MEASURING WIDTH OF MATERIAL ON SAMPLE

CROSS REFERENCE TO RELATED APPLICATION

The present application is a continuation application of U.S. patent application Ser. No. 10/246,453, filed on Sep. 19, 2002, now U.S. Pat. No. 6,791,084 the disclosure of which is incorporated herein by reference.

BACKGROUND OF THE INVENTION

1. Field of the Invention

The present invention relates to a method and a system for when measuring the dimension of a fine pattern shape of an LSI or the like, measuring the dimension of an object to be width-measured with accuracy.

2. Description of the Related Art

Heretofore, in accordance with the description in JP-A-6-347246 for example, in a critical dimension measurement scanning electron microscope (critical dimension measurement SEM) for applying an electron beam to a sample to measure the dimension of the sample, a cursor is adjusted to either a luminance leading part or a luminance trailing part of an object to be measured either on the secondary electron image or on the reflected electron image and the dimension between both sides of the cursor is, as a result, decided as the dimension of the object to be measured.

By the way, as for the technique for evaluating the diameter dimension of an electron beam, there are the techniques disclosed in JP-A-11-224640 and JP-A-11-25898, respectively.

In the technique disclosed in JP-A-6-347246, an electron beam is applied to an object to be measured while scanning the object with the electron beam being applied, and a sample image is formed depending on a quantity of secondary electrons and reflected electrons which have been emitted and generated therefrom, respectively, to measure the width of the object. There is, as a result, encountered the problem that an object to be measured is displayed in a larger size and a gap between patterns or the like is displayed in a smaller size as the diameter of the applied electron beam becomes larger.

While that problem is not so serious when the size of an object to be width-measured is much larger than the diameter of the applied electron beam, for an element which has the dimension only in the range of about several nano meters to about several tens nano meters as elements in recent semiconductor devices for example, the diameter of the applied electron beam (e.g., several nano meters) is so large as to be non-negligible against the size of such semiconductor devices. Thus, the difference occurs between the actual dimension value and the measured dimension value accordingly. There is, as a result, encountered the problem that the measurement accuracy is deteriorated.

SUMMARY OF THE INVENTION

In the light of the foregoing, the present invention has been made in order to solve the above-mentioned problems associated with the prior art, and it is, therefore, an object of the present invention to provide a method and a scanning electron microscope for measuring a width of an object on a sample which are capable of reducing or removing an error in width measurement resulting from the influence of the dimension of an electron beam diameter to obtain an accurate value of a measured width.

In order to attain the above-mentioned object, according to the present invention, there is provided a method of measuring a width of an object on a sample in which the sample is scanned with a beam to measure the width of an object to be width-measured on the sample on the basis of a secondary signal obtained from the sample, wherein the width-measured value of the object of the width measurement obtained on the basis of the secondary signal is corrected with a value with respect to a dimension value of the beam diameter.

By adopting such composition, the error in width measurement resulting from the influence of the beam diameter can be either reduced or eliminated. By the way, concrete examples of the present invention will be described in detail in DETAILED DESCRIPTION OF THE INVENTION.

Other objects, features and advantages of the invention will become apparent from the following description of the embodiments of the invention taken in conjunction with the accompanying drawings.

DETAILED DESCRIPTION OF THE INVENTION

The preferred embodiments of the present invention will hereinafter be described in detail with reference to the accompanying drawings.

Figure 1:
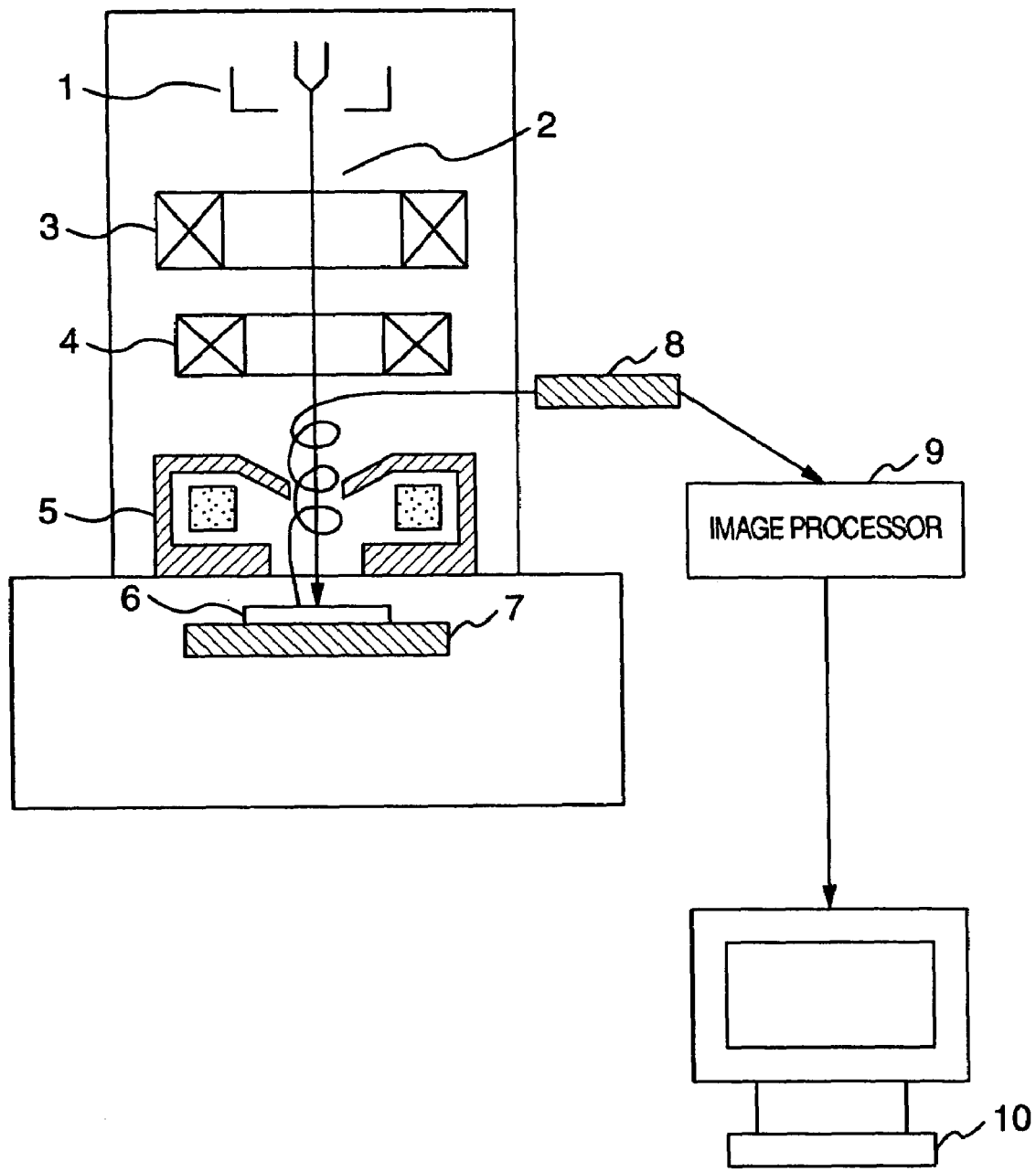
FIG. 1 is a schematic cross sectional view, partly in block diagram, showing construction of a scanning electron microscope according to an embodiment of the present invention.

FIG. 1 is a schematic cross sectional view, partly in block diagram, showing construction of a scanning electron microscope according to an embodiment of the present invention. A suitable voltage is applied from a high-voltage control power source which is controlled by a microprocessor (CPU (not shown)) to an electrode gun 1, and an electron beam 2 is drawn from the electrode gun 1 with a predetermined emission current. The electron beam 2 is then condensed by an electromagnetic lens 3 which is controlled by a lens control power source (not shown) to be applied in the form of a small spot onto a sample 6 through an objective lens 5 which is similarly controlled by the lens control power source. For the objective lens 5, there may be adopted the various forms such as the in-lens system in which a sample is arranged between magnetic poles, the out-lens system in which a sample is arranged at the height different from that of objective lens magnetic poles, or the snorkel system (semi-in-lens system). In addition thereto, the retarding system in which a magnetic voltage is applied onto a sample to decelerate a primary electron beam may also be adopted. Moreover, each of the various lenses may be constructed by the electrostatic type lens which is constituted by a plurality of electrodes. Furthermore, in order to accelerate the electron beam 2 when it is passing through an electron beam path of the objective lens 5, an acceleration cylinder to which a positive voltage is applied may be provided.

The sample 6 which is arranged on a sample holder 7 is scanned through a deflecting lens 4 with the electron beam 2 either in a two-dimensional manner or in a three-dimensional manner containing the direction of application of the electron beam. The sample holder 7 is arranged on a sample stage (not shown) and is provided with the function of being moved to move the sample 6 in a direction (X-Y direction) perpendicular to an optical axis of the electron beam 2. But, the present invention is not intended to be limited thereto. For example, there may be added a rotation function of rotating the sample 6 or the inclination function of inclining the sample with respect to the optical axis of the electron beam 2.

A secondary signal obtained from the secondary electrons, the reflected electrons and the like which have been respectively emitted from the sample 6 through the application of the electron beam 2 onto the sample 6 is detected by a secondary electron detector 8. After the secondary signal detected by the secondary electron detector 8 has been amplified by a signal amplifier (not shown), it is transferred to an image processor 9 to be displayed in the form of a sample image on an image display monitor 10.

The various kinds of operation buttons through which instructions for the setting of the electronic optical system, the setting of the scanning conditions and the like are issued can be displayed in addition to the sample image on the image display monitor 10. In addition, the system according to the present embodiment of the invention is provided with the function of forming and displaying a beam profile on the basis of either a quantity of generated secondary electrons, or luminance information of the sample image displayed on the image display monitor 10. The width-measurement for a pattern of a semiconductor wafer, for example, is carried out on the basis of this beam profile. The calculation of a dimension value based on the beam profile is carried out on the basis of a magnification value of the scanning electron microscope and a distance between the beam profiles.

By the way, while the image processor 9 has been described as a unit integrated with the scanning electron microscope or as a unit applying correspondingly thereto with reference to FIG. 1, of course, the present invention is not intended to be limited thereto. That is to say, the processings as will hereinbelow be described may be executed by a computer which is provided separately from the scanning electron microscope. In this case, there are required a transmission medium through which a detection signal detected by the secondary electron detector 8 is transmitted to the above-mentioned computer from which a signal is in turn transmitted to the lenses, the deflecting system and the like of the scanning electron microscope, and an I/O terminal through which the signals which are transmitted via that transmission medium is inputted or outputted. In addition, a program by which the processings as will hereinbelow described are executed may be registered in a storage medium and also this program may be executed by a control processor having an image memory for supplying a signal(s) necessary to the scanning electron microscope.

The subject matter of the present invention is that the diameter of an applied electron beam, the diameter of an X-ray, the diameter of a laser beam, and the diameter of an ion beam are respectively measured to carry out the plus or minus correction only for the dimension so as to be fitted to a shape of an object to be measured, or when the beam profiles of the secondary electrons or the reflected electrons overlap each other to carry out the correction for the overlapping to display an image having the actual dimension.

More specifically, the diameter of the electron beam to be applied is previously measured with a cross section of a multi-layer film made of a material Ru and a material C, the electron beam is adjusted to the measurement position of an object to be measured using this electron beam diameter thus measured, and a plus or minus correction is carried out for one half the diameter of the electron beam every left and right cursors, or when the dimensions of the electron beam overlap each other, a quantity of overlapping of the electron beam profiles is calculated from the beam profiles of the overlapping electron beams and the luminance therebetween to correct the dimension, thereby displaying the desired image.

For both of the left and right cursors, the plus or minus correction is decided as being minus when carrying out the measurement from the leading part of the luminance, while is decided as being plus when carrying out the measurement from the trailing part of the luminance to correct the dimension for one half the beam diameter or for the overlapping of the electron beams, respectively. In such a manner, the width-measured value which is obtained on the basis of the beam profile is corrected with the value with respect to the dimension value of the beam diameter to allow the accurate width-measurement value to be obtained. The more concrete embodiments will hereinafter be described.

First Embodiment

Figure 2:
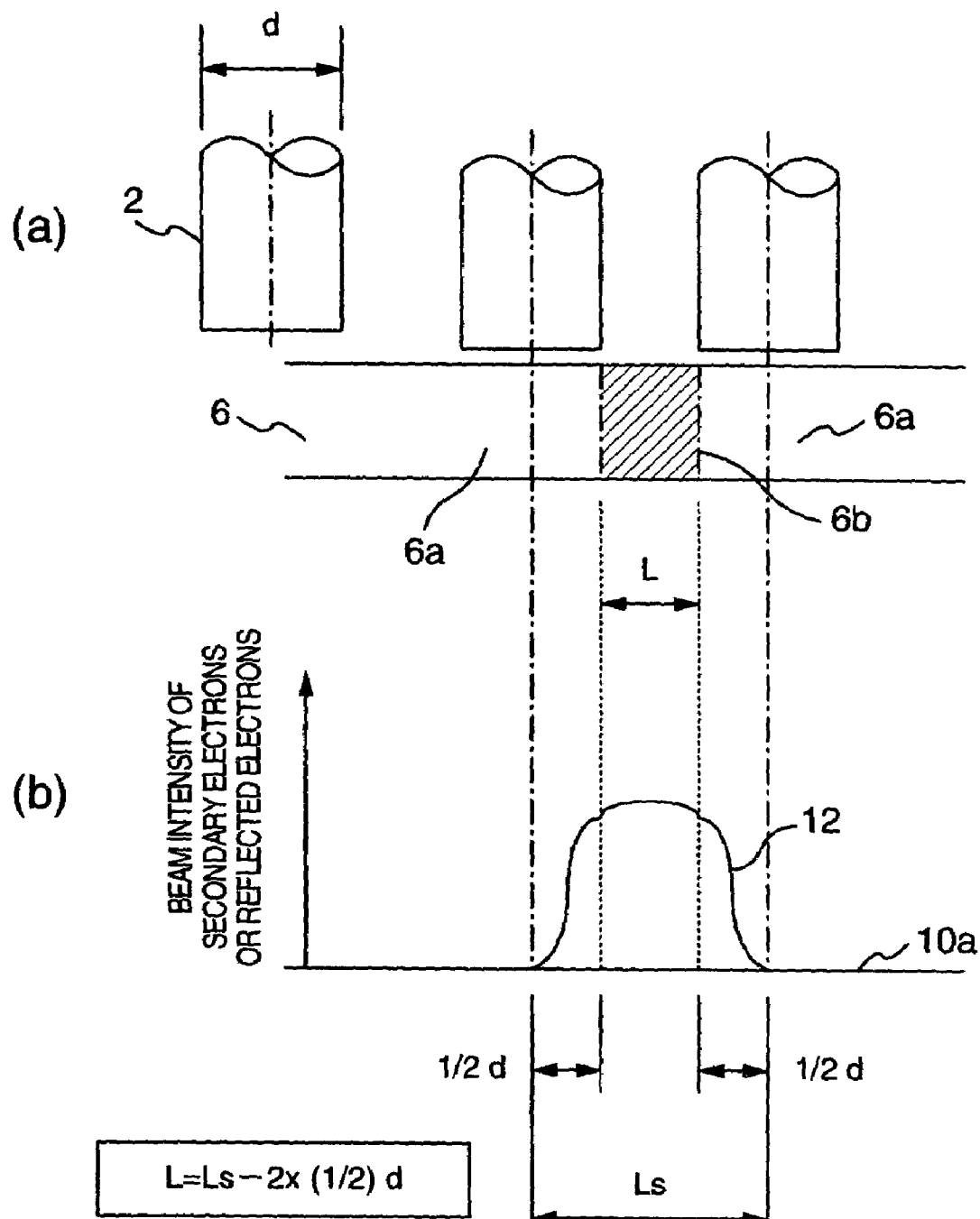
FIG. 2 is a schematic view useful in explaining the principles on the basis of which a width of a pattern or the like is measured on the basis of secondary electrons and the like emitted from a sample.

FIG. 2 is a schematic view useful in explaining the principles on the basis of which a width of a pattern or the like is measured on the basis of the secondary electrons and the like emitted from the sample 6. In the present embodiment, the description will hereinbelow be given with respect to an example in which the width of a sample made of a material C and a material Ru is measured.

The electron beam 2 has a beam diameter d, and the sample 6 is scanned with the electron beam from the left-hand side to the right-hand side in a part (a) of FIG. 2. During the process of the scanning, when a material C part 6a is being scanned with the electron beam 2, a quantity of generated secondary electrons is less. Thus, when a line profile as shown in a part (b) of FIG. 2 is formed, the beam intensity shows about zero. However, as the electron beam 2 comes near to a material Ru part 6b, a large number of secondary electrons begin to be emitted from the material Ru having a higher efficiency of generation of secondary electrons. When the beam intensity of such secondary electrons or reflected electrons is displayed on the image display monitor 10, the intensity is displayed in the form of a beam profile 12. That is to say, the beam intensity for the material Ru part 6b starts to be displayed on the image display monitor from the boundary between the material C part 6a and the material Ru part 6b by a distance corresponding to one half the electron beam diameter d, and similarly, after the scanning with the electron beam has passed the material Ru part 6b made of the material Ru, the beam intensity is displayed so widely by one half the electron beam diameter d. The width of the material Ru part 6b is, as a result, measured in a larger size than that of the actual dimension.

This results in that in the scanning electric microscope, the material Ru part 6b having an actual dimension L is measured as having the dimension Ls of the beam profile which is larger than the actual diameter L by the electron beam diameter d. Then, the diameter different from the actual diameter is measured.

In the present embodiment, in order to solve the problem as described above, when measuring the width of the material Ru part 6b, the proper measured value is obtained by subtracting the electron beam diameter d from the dimension Ls of the beam profile. According to this method, it is possible to suppress or eliminate the measurement error due to the influence of the dimension of the beam diameter.

By the way, in the system according to the present embodiment, in order to eliminate previously such a measurement error, the evaluation of the dimension of the beam diameter is carried out using a sample for evaluation used to evaluate the dimension of the beam diameter d whenever changing the optical conditions, whenever exchanging a semiconductor wafer as an object to be measured for another one, or at arbitrary timing.

Figure 8A:
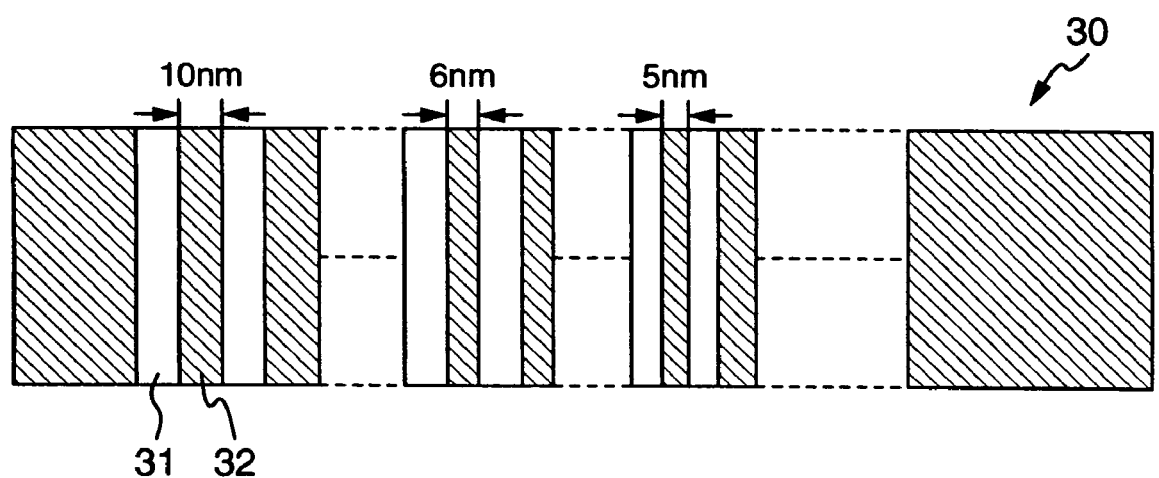
FIGS. 8A and 8B are respectively a diagram showing a sample for evaluation and a perspective view showing structure of a sample stage.
Figure 8B:
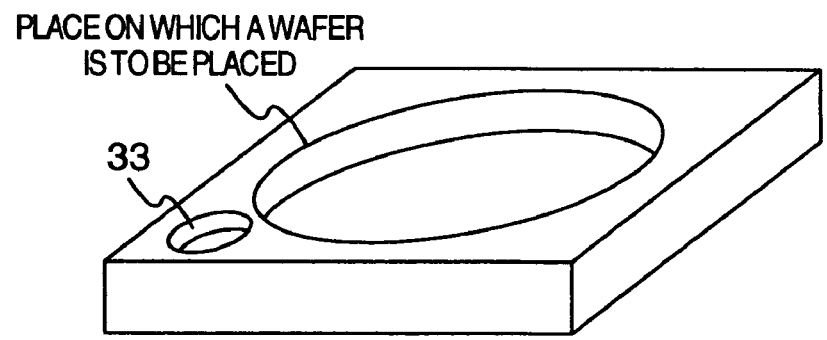

FIG. 8A is a schematic view showing structure of an example of a sample for evaluation. In the system according to the present embodiment, a sample 30 for evaluation is attached to the sample holder 7, a sample stage on which the sample holder 7 is to be arranged, or an arbitrary position within a sample room self-containing a sample which is to be irradiated with the electron beam and the sample stage, and the like. In addition thereto, a sequence for carrying out the evaluation of the dimension of the beam diameter at various kinds of timing as has already been described is incorporated in the system. FIG. 8B is a perspective view showing structure of a sample stage having a recess part 33 on which the sample 30 for evaluation is to be placed.

The sample 30 for evaluation is made of combination of materials such as ruthenium 31 (Ru), and carbon 32 (C), or tungsten (W) and carbon (C) between the atomic numbers of which are large in difference. In this case, if the response of a step signal imaged by the scanning electron microscope is differentiated, then the beam profile is obtained through the differentiation, and then if a threshold such as a half-width is set, then the quantitative evaluation of the beam diameter becomes possible. The dimension value of the beam diameter obtained in such a manner is stored in a storage device to be used in the correction for the width-measured value as will be described later. In the system of the present embodiment, the sequence is incorporated therein in which when the evaluation different from that for a predetermined beam diameter is made during the evaluation of the dimension of the beam diameter, a sequence for changing predetermined optical conditions is carried out to evaluate the dimension of the beam diameter again.

In addition, in the case where it is evaluated that even when carrying out the evaluation of the dimension of the beam diameter again, a predetermined beam diameter is not yet obtained, there is the possibility that the sample for evaluation is contaminated so that it is in the state in which the dimension of the beam diameter can not be accurately evaluated. The error display may be, as a result, made or the message to urge the exchange of a sample for evaluation for another one or to urge the cleaning may be displayed on the image display monitor 10. In addition, when the cause due to which a predetermined beam diameter can not be obtained is present in an electron microscope of the scanning electron microscope, that effect may also be displayed on the image display monitor 10.

By the way, the various methods of evaluating a dimension as disclosed in JP-A-11-224640 and JP-A-11-25898 may also be applied to the present invention.

In addition, the width measurement method according to the present invention is particularly effective for a sample in which there is no difference in height between a certain device as an object to be width-measured and any of other devices, and hence no increase in a quantity of secondary electrons due to the edge effect can be expected.

Second Embodiment

Figure 3:
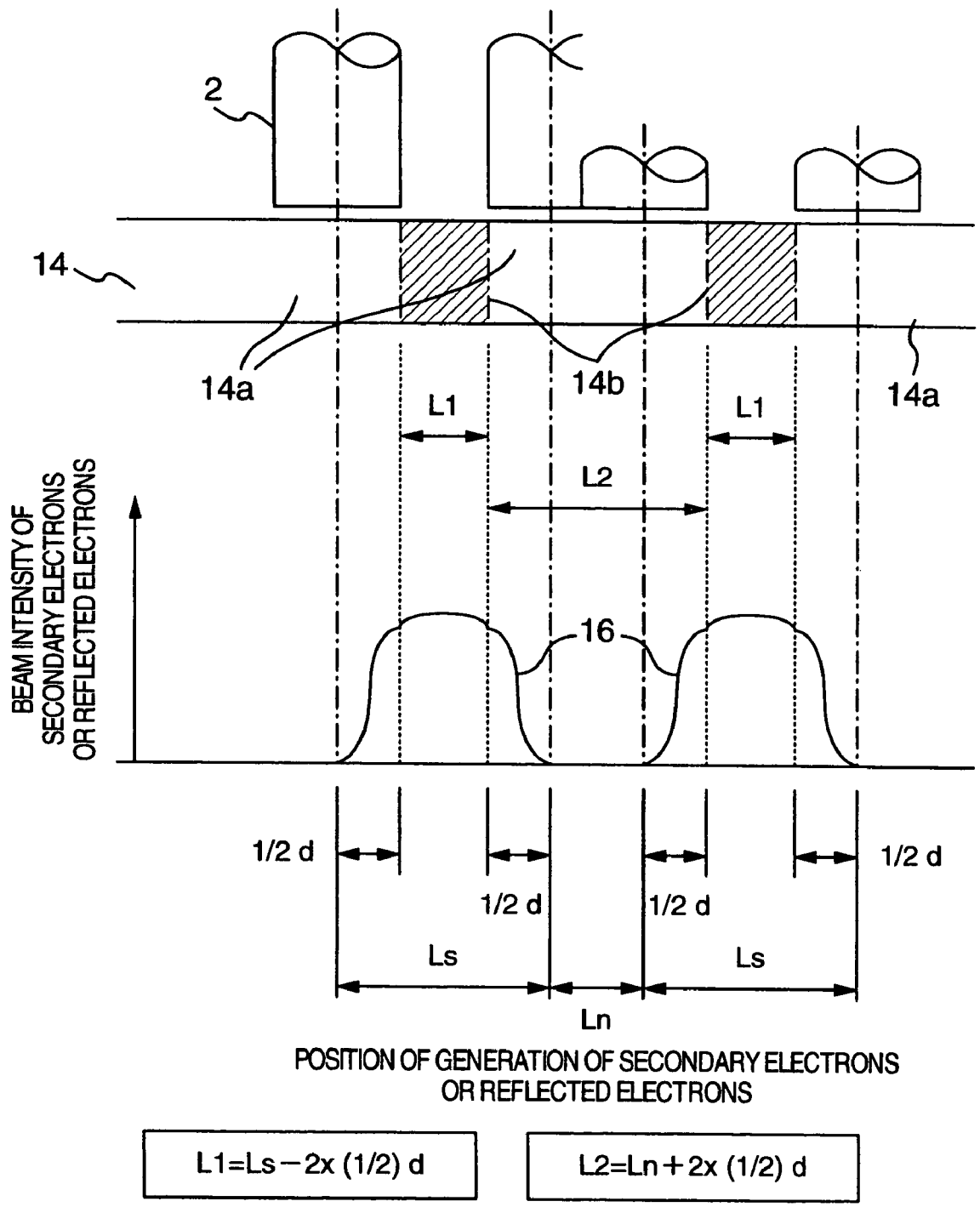
FIG. 3 is a schematic view useful in explaining a width measurement method adapted to measure a width between members each having a high efficiency of generation of secondary electrons.

FIG. 3 is a schematic view useful in explaining the width measurement method which is adapted to measure the width between members each having a high efficiency of generation of secondary electrons. Also, FIG. 3, similarly to the example shown in FIG. 2, shows the relationship between a quantity of generated secondary electrons when scanning the member with the electron beam from the left-hand side to the right-hand side in the figure and the actual dimension.

When a material C part 14a is being irradiated with the electron beam 2, a quantity of generated secondary electrons is less and hence the beam intensity shows about zero. However, as the electron beam 2 comes near to a material Ru part 14b, the secondary electrons begin to be emitted from the material Ru part 14b. The situation in which the secondary electrons are generated up to a time point when the electron beam 2 has passed through the second material Ru part 14b is displayed in the form of a beam profile 16. The dimension between the material Ru part 14b and the material RU part 14b adjacent thereto is, as a result, measured as Ln in the beam profile 16 for the actual dimension L2. In the case where the width of the part containing the elements with a high efficiency of generation of secondary electrons as in the first embodiment is not measured, but the width of the part sandwiched between the materials each having a high efficiency of generation of electron beams is measured, the actual diameter L2 can be calculated by adding the electron beam diameter d to the beam profile dimension Ln.

While above, in the first and second embodiments according to the present invention, the description has been given with respect to the example in which the electron beam diameter d is previously obtained, and this beam diameter value is added or subtracted to or from the value obtained on the basis of the beam profile, respectively, it is also possible that the addition or subtraction is not only carried out, the dimension value of the beam diameter is but also corrected in view of the system situation and the like to calculate the accurate width value on the basis of the value obtained after completion of the correction.

In addition, the corresponding value for the beam diameter is not only added or subtracted to or from the beam profile dimension, but the arithmetic operation method and the necessity or unnecessity of the arithmetic operation should be suitably selected in correspondence to the situation of a sample. For example, in the case where three members different in efficiency of generation of secondary electrons are arranged in the order of the generation efficiency, and a width of the member located right in the middle thereamong is measured, the value corresponding to one half the beam diameter needs to be added to the width-measured value on the side having a larger efficiency of generation of secondary electron beams, while the value corresponding to one half the beam diameter needs to be subtracted from the width-measured value on the side having a lower efficiency of generation of secondary electrons. That is to say, a quantity of correction becomes zero in total and hence the value which is obtained in the beam profile can be applied in its entirety.

Such selection of the arithmetic operation methods and the necessity or unnecessity of the arithmetic operation is previously set on the basis of the setting by the recipe, which makes it possible to carry out the automatic inspection. That recipe is set in a recipe setting screen displayed on the image display monitor 10. In the system according to the present embodiment, as for the choices of setting an object to be width-measured, there may be provided the choices of the information with respect to the arrangement of the materials adjacent to an object to be width-measured such as Rn-C-Ru or C-Ru-C. Then, the correction based on the value with respect to the dimension value of the beam diameter as has already been described may also be adapted to be automatically carried out on the basis of the choices. According to the system in which such setting can be carried out, even if an operator has not especially the knowledge with respect to the present invention, he/she can automatically correct an error in width measurement on the basis of a dimension value of a beam diameter.

In addition, if an image obtained from the scanning electron microscope is displayed together with the recipe setting picture, then an operator can carry out the proper setting while confirming the situation on a sample.

Third Embodiment

Figure 4A:
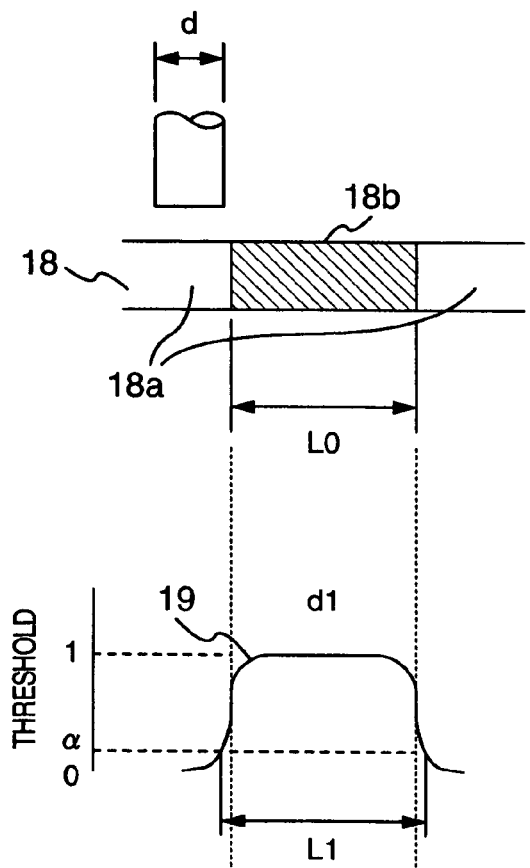
FIGS. 4A to 4C are respectively schematic views useful in explaining an example in which the dimension of a sample is measured using an applied beam with a certain beam diameter.
Figure 4B:
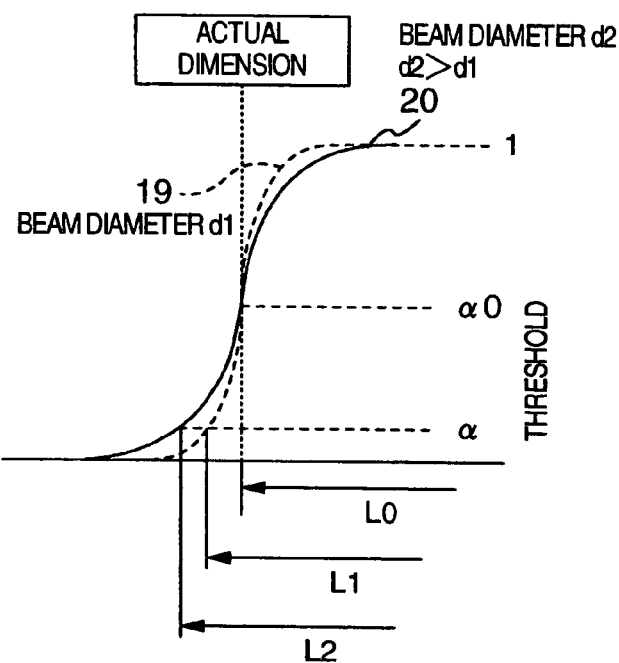
Figure 4C:
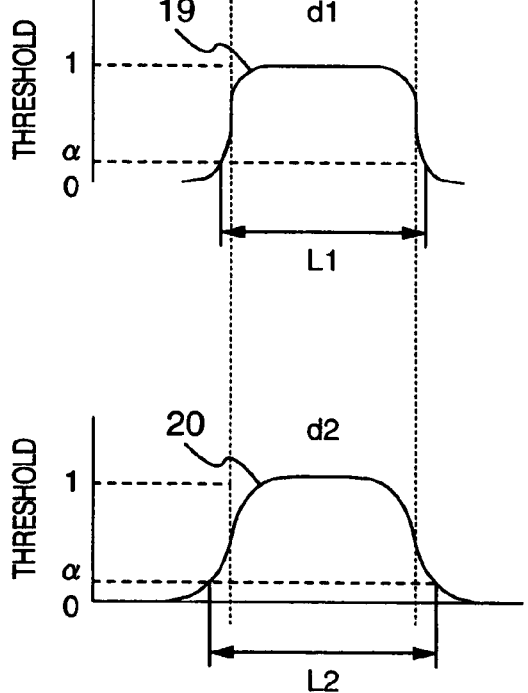
Figure 4C:
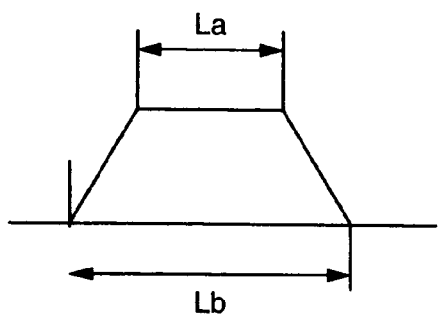

FIGS. 4A to 4C are respectively schematic views useful in explaining an example in which the dimension of a sample is measured using the applied beam with a certain beam diameter. In the present embodiment, the description will hereinbelow be given with respect to an example in which as shown in a part (a) of FIG. 4A, a sample 18 made of a material C part 18a and a material W part 18b is measured. A material W, similarly to a material Ru, has a higher efficiency of generation of secondary electrons than that of a material C.

When the sample 18 is scanned with an electron beam with a beam diameter d1, and a beam profile is formed on the basis of the secondary electrons or the reflected electrons which are emitted from the sample 18 during the scanning, a profile of the beam diameter as shown in a part (b) of FIG. 4A is obtained. While in the present embodiment according to the invention, a certain level of the beam profile is set as a slice level to obtain the width-measurement value on the basis of the profile of the part of interest, since the width-measured value thus obtained is different from the actual dimension, it is necessary to carry out the correction therefor.

Likewise, a profile 20 of the beam diameter when the sample 18 is irradiated with an electron beam with a beam diameter d2 is shown in a part (c) of FIG. 4A. Since the secondary electron profile changes depending on the dimension of a beam diameter, a quantity of correction becomes the function of the slice level and the beam diameter. The relationship between the slice level and the measured dimension is shown in FIG. 4B. From this figure, it is estimated that a quantity of correction is proportional to the change in slice level and the beam diameter. Consequently, an actual dimension Lo can be expressed from a measured dimension L, a beam diameter d and a slice level $\alpha$:

$$Lo = L2 + k(\alpha - \alpha o)d \quad (1)$$

where k is a correction efficiency, and $\alpha o$ is a slice level (e.g., 0.5) as the reference. If $K = k(\alpha - \alpha o)d$ can be obtained from the slice level and the beam diameter in such a manner, then it is possible to obtain the proper profile even when a sample having a trapezoidal shape as shown in FIG. 4C.

Fourth Embodiment

Figure 5:
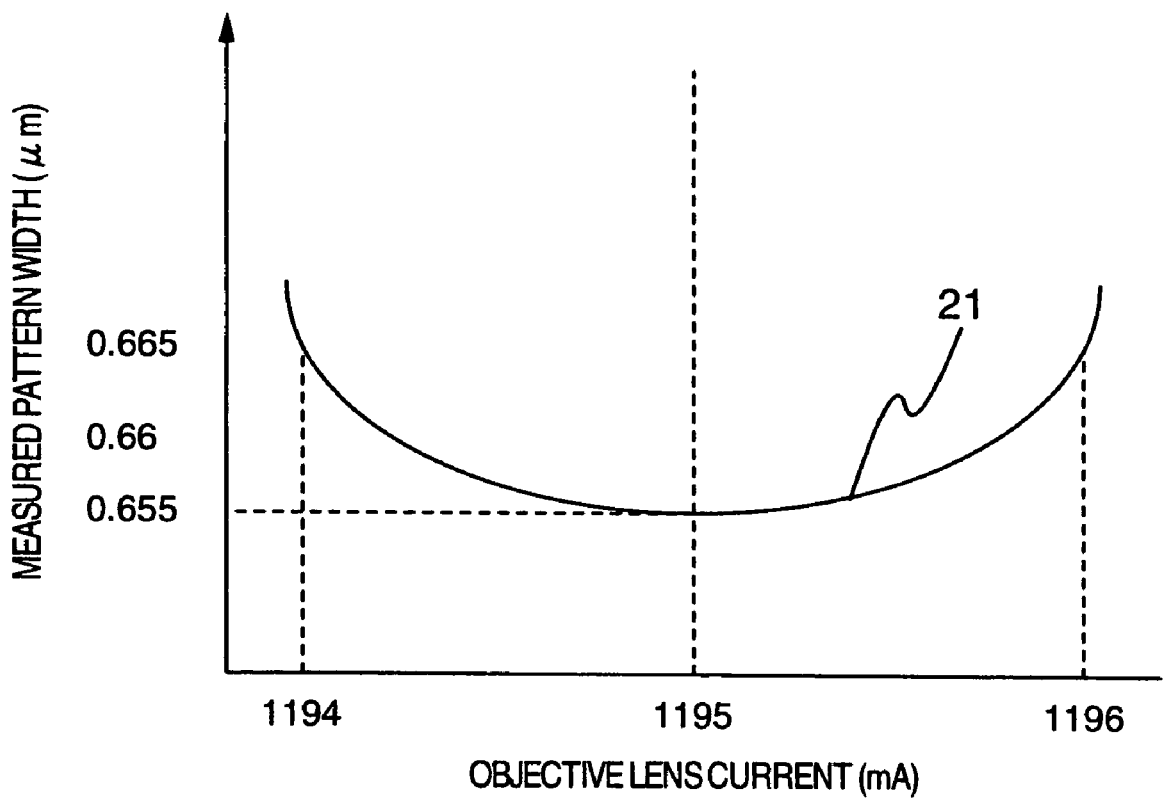
FIG. 5 is a graphical representation useful in explaining the phenomenon in which a SEM image of a width-measured object spreads depending on the dimension of a beam diameter.

FIG. 5 is a graphical representation useful in explaining the phenomenon in which an SEM image of the width-measured value spreads depending on the dimension of the beam diameter on the basis of an actual example in which a pattern width of 0.65 μm was measured. When an objective lens current is 1,195 mA, there is obtained a just focus part in which the beam is condensed most slenderly to provide the width-measured value of 0.655 μm. Then, it was confirmed that if the electron beam is defocused by +1 mA, then the resultant width-measured value is measured so large as to be about 0.665 μm in both of the directions so that the measured pattern width becomes large depending on the dimension of the beam diameter.

Since the beam diameter changes depending on the state of the focus and the width-measured value changes as a result, the fluctuation value of the focus may be detected to correct the dimension value of the beam diameter or the width-measured value on the basis of the fluctuation value thus detected. When a sample, for example, is charged with electricity, the focus may be deviated due to the electrification in some cases. Thus, the situation of the electrification may be measured with an electrostatic measuring instrument or the like to correct the dimension value of the beam diameter or the width-measured value on the basis of the value corresponding to that situation.

In addition, if the existing autofocusing function is made effective, then the evaluation value for a focal point is calculated in the form of a differentiated value of the intensity of the secondary electrons or the reflected electrons. Thus, a part in which the signal intensity changes largely in the scanning area may be judged as the position of the focal point so that the focus can not be adjusted to a bottom part or a upper surface of an irregularity in some cases. That is to say, when an object to be width-measured is a upper part of a convex pattern or the internal part of a contact hole, the width of an object to be width-measured is measured with the electron beam being out of focus. In such a case, a quantity of correction for a beam diameter or a quantity of correction for a width-measured value is previously stored every object to be observed, and when an object to be observed of interest is selected, such a quantity of correction is added or subtracted, which makes it possible to obtain the accurate dimension value of the beam diameter or the accurate width-measured value. Of course, it may also be available that a quantity of correction to be changed is stored in the form of a correction coefficiency and a beam diameter or a width-measured value is multiplied or divided by this correction efficiency to obtain the accurate dimension value of a beam diameter or an accurate width-measured value.

Fifth Embodiment

Figures 6A, 6B:
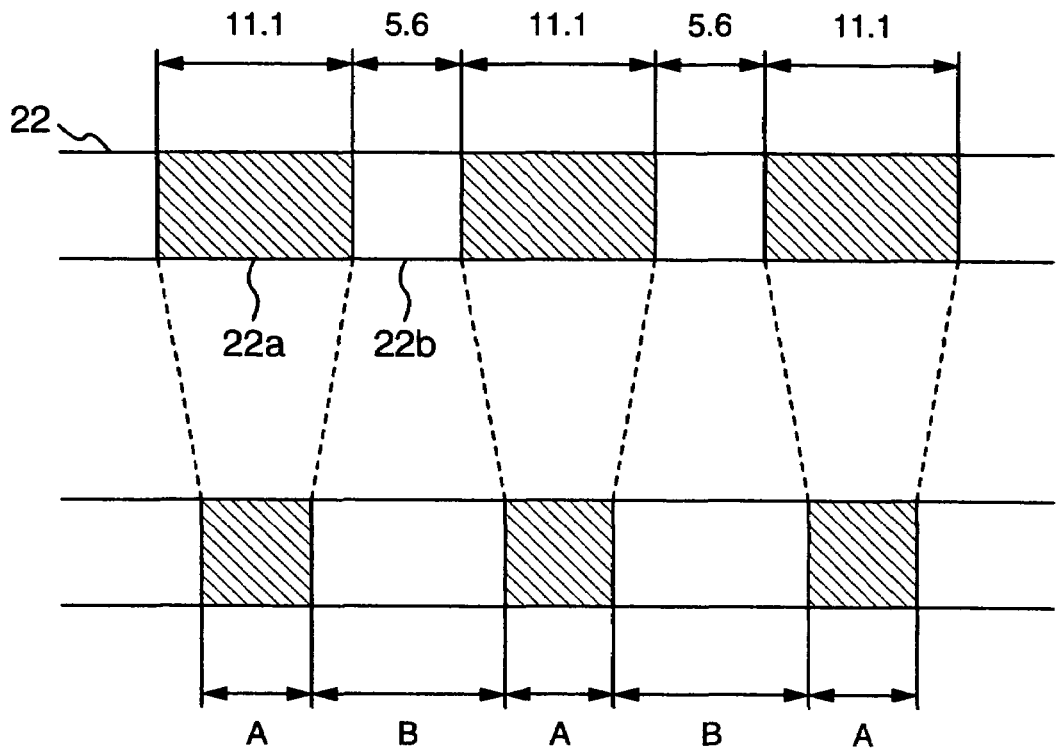
FIGS. 6A and 6B are respectively a schematic view and a diagram useful in explaining the phenomenon in which a SEM image of a width-measured object spreads depending on the dimension of a beam diameter using a multi-layer film having the known dimension.

FIG. 6A is a schematic diagram useful in explaining the phenomenon in which the SEM image of the width-measured value spreads depending on the dimension of a beam diameter using a sample 22 in which the dimension of a multi-layer film is known. The sample 22 is a multi-layer film and is made of a material C part 22a and a material W part 22b. The width of the material C part 22a is 11.1 nm and the width of the material W part 22b is 5.6 nm.

These dimensions were measured at acceleration voltage of 1 kV (the beam diameter is about 4 nm) and at acceleration voltage of 5 kV (the beam diameter is about 2 m) for changing the beam diameter using the scanning electron microscope. As shown in a Table of FIG. 6B, the width-measured value of the material W part 22b was, as a result, 9.4 nm and the with-measured value of the material C part 22a was 7.3 nm at the acceleration voltage of 1 kV. Thus, the measured width of the material W part 22b was larger than the actual dimension by 3.8 nm.

In addition, at the acceleration voltage of 5 kV, likewise, the measured width of the material W part 22b was larger than the actual dimension by 1.8 nm. For this measurement result as well, it could be confirmed that in the scanning electron microscope, a displayed image corresponding to the dimension value of the measured width is larger than the actual dimension by the corresponding quantity for the beam diameter.

Sixth Embodiment

Figure 7A:
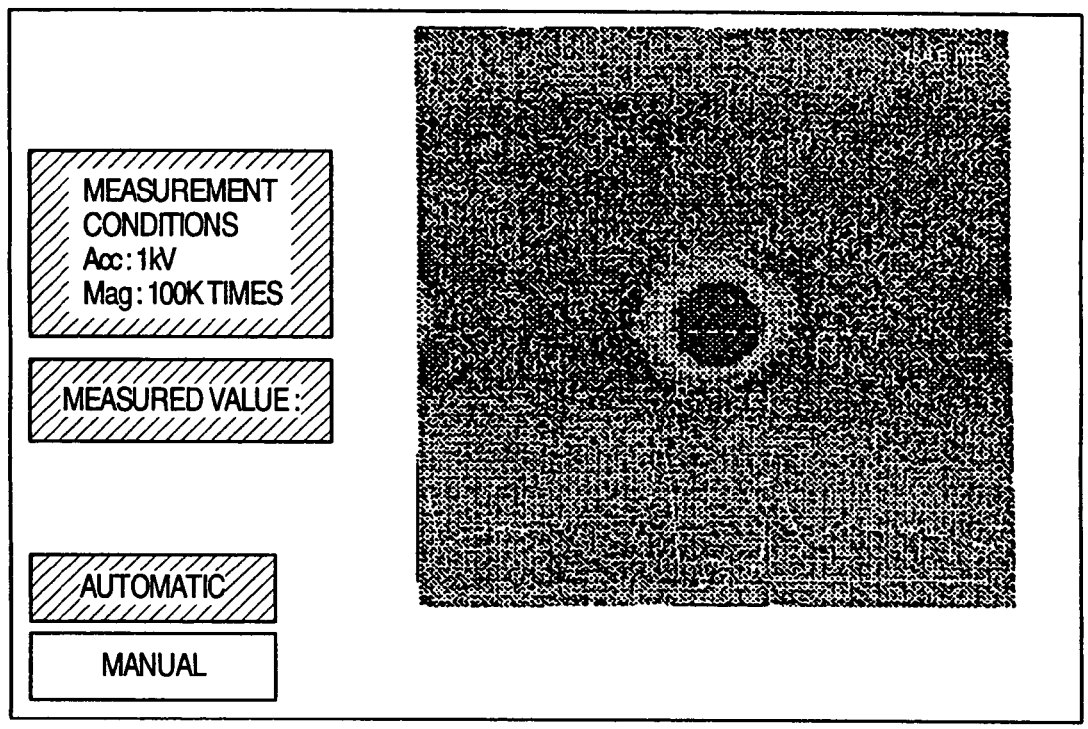
FIGS. 7A and 7B are respectively views each showing a display example of an image display monitor.
Figure 7B:
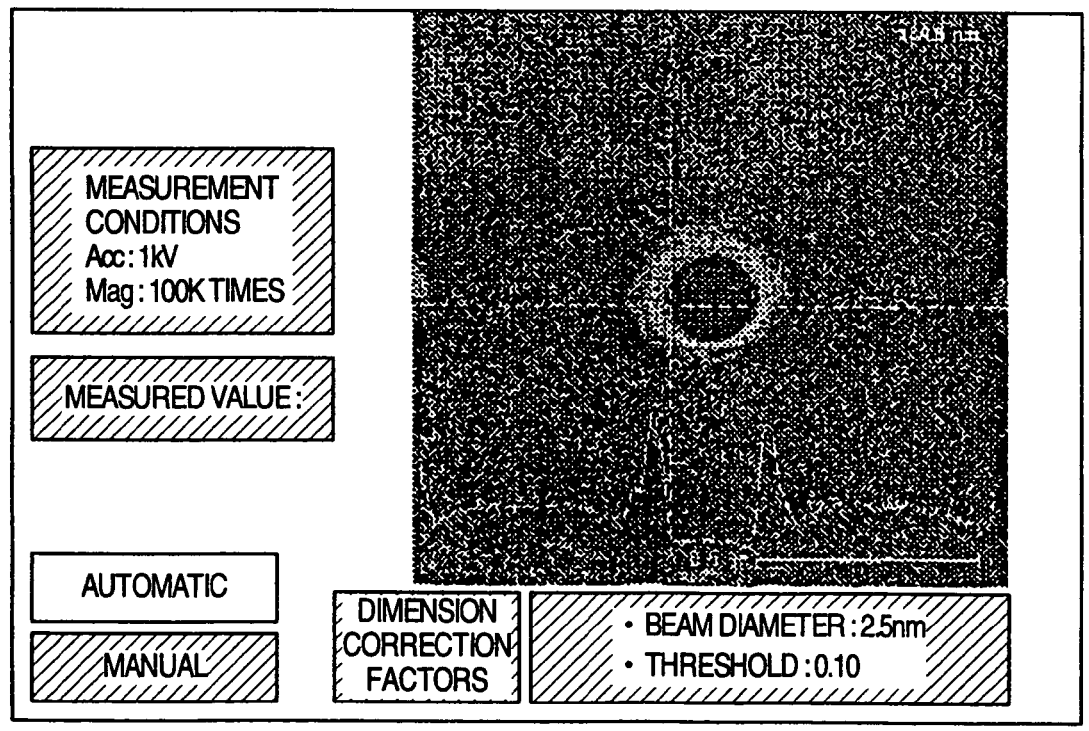

FIGS. 7A and 7B show an example of the display on the image display monitor. Now, FIG. 7A shows the case where the width of an object to be width-measured is measured with an automatic mode. On the other hand, FIG. 7B shows the case where the width of an object to be width-measured is measured with a manual mode. Then, in the case of the manual mode, dimension correction factors and their values are adapted to be displayed and hence the grounds of the dimension correction are clearly demonstrated.

According to the present embodiment, when a pattern having a pitch of 30 nm, for example, is measured with a beam with a diameter of 3 nm, though the pattern is formed at pitch of 30 nm, and at pitch of 30 nm in real dimension, the measured dimension of the pattern are respectively at pitch of 33 nm and at pitch of 27 nm in accordance with the conventional method, the difference from other systems (TEM (Transmission Electron Microscope) and the like) becomes a problem. However, the measurement result is corrected with a correction value from the beam profile which is previously measured, whereby it is possible to solve the present problem. When the method according to the present invention is utilized, there is offered the effect that an image with a measured value corresponding to a width value which is in close proximity to its actual dimension can be displayed, an error between the present system and any of other measurement systems is also prevented from being caused, and so forth.

Consequently, as described above, when a dimension near an electron beam diameter is measured with a conventional SEM for width measurement, it is impossible to avoid an error for an electron beam diameter. However, if the present invention is utilized, there is offered the the effect that with respect to the dimension as well of a fine LSI or the like which is near the dimension of an electron beam diameter, the dimension value thereof which is in close proximity to the dimension of an actual object can be readily measured.

By the way, if how large a beam diameter becomes actually as compared with an object to be observed on a sample is exemplified together with an image on a scanning electron microscope, then an operator can confirm through the visual observation how large an error in width measurement generated depending on the dimension of a beam diameter becomes. For example, how large value an electron beam diameter needs to be set to, or necessity or unnecessity of the correction technique which has been described can be readily judged in line with the situation of a pattern in the width measurement, the generation of a recipe for setting or observation conditions, or the like on a scanning electron microscope for measuring a width of a pattern of a semiconductor wafer. While with respect to the display of the dimension of a beam diameter, either a numeric value may only be displayed or a circle which is obtained by imitating an electron beam spot may be displayed, in the case of the latter, it is possible to grasp more readily the relationship between the dimension of the electron beam spot and the dimension of an object to be width-measured on a scanning electron microscope.

In addition, in particular, a scanning electron microscope for measuring the dimension of a pattern on a semiconductor wafer is adapted to measure a plurality of places to be width-measured on the same semiconductor wafer. Then, if the dimension of an electron beam diameter is measured at timing which does not permit predetermined throughput to be reduced in terms of a semiconductor inspection system, and the resultant dimension of the beam diameter is corrected every width-measured place in accordance with the situation of charge-up of a semiconductor wafer, the kind of object to be width-measured and the like to be used, then it is possible to carry out the width measurement of a pattern with high accuracy while maintaining the throughput.

By the way, while the above description has been mainly given with respect to a system in which a sample is scanned with an electron beam to measure a width of a pattern on the sample, the present invention is not intended to be limited thereto. That is to say, the present invention may also be applied to all of systems for detecting a secondary signal (secondary electrons, reflected electrons, light, X-rays or the like) obtained by scanning a sample with a beam to measure the dimension of a pattern on the sample. As for other systems, there are a scanning ion microscope for scanning a sample with an ion beam to detect the resultant secondary electrons or secondary ions, a laser microscope using a laser beam, an X-ray microscope for applying X-rays, and the like.

As set forth hereinabove, according to the present invention, it is possible to reduce or eliminate an error in width measurement resulting from the dimension of a beam diameter and also it is possible to carry out the accurate width measurement.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A charged particle beam apparatus comprising:
   a scanner for scanning a charged particle beam on an object, said object having a width;
   a first detector for detecting charged particles emitted from the object;

a second detector for detecting a focus condition of the charged particle beam or an electrification condition of a sample; and a processor for calculating the width of a pattern of the sample by adding or subtracting a corrected based on the detected focus condition or value corresponding to a diameter of the electrification condition, from a value obtained by measuring the width of the line profile formed based on a line profile based on the charged particles emitted from the object, said line profile having a width and for calculating the width of a pattern of the sample based on a line profile which is formed by the detected charged particles;

wherein the processor calculates the width value of a pattern of the sample by adding or subtracting a beam diameter value, and corrects the beam diameter value or width value of the pattern of the sample based on a focus condition of the charged particle beam.

2. The method according to claim 1, wherein the diameter of the charged particle beam is corrected in accordance with a focus degree of the charged particle beam.

3. A charged particle beam apparatus comprising:

a charged particle source for emitting a charged particle beam;

a focusing lens for focusing the charged particle beam;

a deflector for deflecting the charged particle beam toward an object, said object having a width;

a detector for detecting charged particles emitted from the object and detecting a focus condition of the charged particle beam or an electrification condition of a sample; and a processor for calculating the width of a pattern of the sample based on a line profile which is formed by the detected charged particles;

wherein the processor calculates the width value of a pattern of the sample by adding or subtracting a beam diameter value, and corrects the beam diameter value or width value of the pattern of the sample based on a focus condition of the charged particle beam.

4. A program product for operating an apparatus for measuring a diameter of a charged particle beam, the apparatus comprising a charged particle source for emitting a charged particle beam, a focusing lens for focusing the charged particle beam, a deflector for deflecting the charged particle beam toward an object on a sample, a detector for detecting charged particles emitted from the sample, and a processor for calculating a width of the object based on the detected charged particles, the program product being arranged to cause the apparatus to perform the steps of:

(a) scanning the charged particle beam on the object;

(b) detecting the charged particles emitted from the object;

(c) detecting a focus condition of the charged particle beam or an electrification condition of a sample;

(d) forming a line profile based on the charged particles emitted from the object, said line profile having a width; and (e) calculating the width of the object by adding or subtracting a value corresponding to a diameter of the electrification condition, from a value obtained by measuring the width of the line profile; and calculating the width of a pattern of the sample based on a line profile which is formed by the detected charged particles;

wherein the width value of a pattern, of the sample is calculated by adding or subtracting a beam diameter value, and corrects the beam diameter value or width value of the pattern of the sample based on a focus condition of the charged particle beam.

* * * * *